(12) United States Patent
Liu et al.

(10) Patent No.: US 11,324,127 B2
(45) Date of Patent: May 3, 2022

(54) ELECTRONIC DEVICE HAVING A FASTENER

(71) Applicant: Wistron Corp., New Taipei (TW)

(72) Inventors: Yu-Ju Liu, New Taipei (TW); Huang Ming Chang, New Taipei (TW); Bo-Ru Zhu, New Taipei (TW)

(73) Assignee: WISTRON CORP., New Taipei (TW)

( * ) Notice: Subject to any disclaimer, the term of this patent is extended or adjusted under 35 U.S.C. 154(b) by 2 days.

(21) Appl. No.: 16/676,558

(22) Filed: Nov. 7, 2019

(65) Prior Publication Data

US 2020/0413549 A1 Dec. 31, 2020

(30) Foreign Application Priority Data

Jun. 25, 2019 (TW) ................................ 108208126

(51) Int. Cl.
*H05K 5/00* (2006.01)
*H01H 13/86* (2006.01)
*G06F 3/02* (2006.01)

(52) U.S. Cl.
CPC ......... *H05K 5/0013* (2013.01); *G06F 3/0202* (2013.01); *G06F 3/0221* (2013.01); *H01H 13/86* (2013.01); *H05K 5/0017* (2013.01)

(58) Field of Classification Search
CPC .. H05K 5/0017; H05K 5/0013; G06F 3/0202; G06F 3/0221
See application file for complete search history.

(56) References Cited

U.S. PATENT DOCUMENTS

| | | | | | |
|---|---|---|---|---|---|
| 4,585,122 | A | * | 4/1986 | Stegenga | H05K 9/0067 361/801 |
| 5,715,139 | A | * | 2/1998 | Nakajima | G06F 1/1616 |
| 5,808,861 | A | * | 9/1998 | Nakajima | G06F 1/1658 361/679.27 |
| 7,984,935 | B2 | * | 7/2011 | Luo | H04M 1/0252 292/87 |
| 9,445,733 | B2 | * | 9/2016 | Tanaka | A61B 5/683 |
| 10,005,611 | B2 | * | 6/2018 | Rayner | H04M 1/185 |
| 10,429,900 | B1 | * | 10/2019 | Kitamura | G06F 3/0221 |
| 10,554,239 | B2 | * | 2/2020 | Wang | H04B 1/3888 |
| 10,739,826 | B1 | * | 8/2020 | Knoppert | G06F 1/166 |
| 10,848,651 | B2 | * | 11/2020 | Tsai | H04N 5/2253 |
| 2003/0007822 | A1 | * | 1/2003 | Lin | G06F 3/0221 400/492 |
| 2003/0034987 | A1 | * | 2/2003 | Webb | G06F 1/169 345/629 |
| 2008/0284663 | A1 | * | 11/2008 | Arima | G06F 1/166 343/702 |
| 2008/0285216 | A1 | * | 11/2008 | Kobayashi | G06F 1/1616 361/679.08 |
| 2008/0316695 | A1 | * | 12/2008 | Arends | H05K 7/142 361/679.55 |

(Continued)

*Primary Examiner* — Rockshana D Chowdhury
*Assistant Examiner* — Douglas R Burtner
(74) *Attorney, Agent, or Firm* — Locke Lord LLP; Tim Tingkang Xia, Esq.

(57) ABSTRACT

An electronic device includes a casing and an electrical component. The casing includes a first casing body, a second casing body and a fastener. The second casing body is located on the first casing body, and the fastener detachably clamps a side of the first casing body and the second casing body. The electrical component is located between the first casing body and the second casing body.

16 Claims, 10 Drawing Sheets

(56) References Cited

U.S. PATENT DOCUMENTS

| | | | | |
|---|---|---|---|---|
| 2009/0053590 A1* | 2/2009 | Yamaguchi | ......... | H01M 50/213 |
| | | | | 361/679.01 |
| 2009/0279238 A1* | 11/2009 | Kobayashi | ............ | G06F 1/1635 |
| | | | | 361/679.09 |
| 2012/0118773 A1* | 5/2012 | Rayner | ................... | H05K 5/069 |
| | | | | 206/320 |
| 2014/0029185 A1* | 1/2014 | Leong | ................... | G06F 1/1669 |
| | | | | 361/679.08 |
| 2014/0055936 A1* | 2/2014 | Wang | .................... | G06F 3/0221 |
| | | | | 361/679.15 |
| 2014/0055937 A1* | 2/2014 | Wang | .................... | G06F 1/1669 |
| | | | | 361/679.17 |
| 2015/0049423 A1* | 2/2015 | Hsu | ....................... | G06F 3/0202 |
| | | | | 361/679.09 |
| 2015/0062787 A1* | 3/2015 | Wilson | .................. | H04M 1/185 |
| | | | | 361/679.01 |
| 2015/0257285 A1* | 9/2015 | Wilson | .................... | H04M 1/18 |
| | | | | 224/235 |
| 2016/0139679 A1* | 5/2016 | Sano | ..................... | G06F 1/1632 |
| | | | | 345/168 |
| 2017/0228038 A1* | 8/2017 | Tangen | ................. | G06F 1/1643 |
| 2017/0282060 A1* | 10/2017 | Wang | ....................... | G06F 1/169 |
| 2018/0364765 A1* | 12/2018 | Kitamura | ............. | G06F 3/0202 |

\* cited by examiner

ELECTRONIC DEVICE HAVING A FASTENER

CROSS-REFERENCE TO RELATED APPLICATIONS

This non-provisional application claims priority under 35 U.S.C. § 119(a) on Patent Application No(s). 108208126 filed in Taiwan, R.O.C. on Jun. 25, 2019, the entire contents of which are hereby incorporated by reference.

TECHNICAL FIELD

The disclosure relates to an electronic device, more particularly to an electronic device having a fastener.

BACKGROUND

With the advancement of technology and the improvement of lifestyle, electronic products are moving toward a trend of thin and light design. Taking wireless keyboards as an example, in recent years, the consumer market has become more and more demanding on the thickness of the wireless keyboards. However, the assembly process and technique of the conventional wireless keyboards does not satisfy the trend of thinness and even results in other issues.

In detail, there are three conventional ways to assemble the upper and bottom casings of wireless keyboard: the first way is to apply adhesive between the upper and bottom casings to adhere them together, however, the adhesive makes the disassembly process difficult to be implemented and thereby increasing the difficulty of maintenance, forcibly disassembling the upper and bottom casings will easily cause structural damage to these casings, and the stickiness of the adhesive will naturally decrease over time and thereby reducing the assembly reliability; the second way is to apply internal hooking structures between the upper and bottom casing, however, the internal hooking structures are located inside the keyboard and which makes the assembly and disassembly processes difficult to be implemented, the internal hooking structures are easily broken during the assembly and disassembly processes, and the hooking structures must have a certain length so that the upper and bottom casings must have a large internal space for accommodating the hooking structures and thereby increasing the overall thickness of the keyboard and not satisfying the trend of thinness; and the third way is to fix the upper and bottom casings by screwing, however, screws require thread holes formed on the appearance of the casings, screws and thread hole drilling increase the manufacturing cost and result in longer assembly and disassembly time, the assembly and disassembly processes often lead to thread damage, and the casings mush have a large thickness for the firm engagement with the screws and thereby increasing the overall thickness of the keyboard and either not satisfying the trend of thinness.

Besides the foregoing problems, the casings of the conventional wireless keyboards are limited to a single color or at most two colors, so the appearance of the conventional wireless keyboards usually has a poor color combination and thus lacking economic value added.

Therefore, how to produce an easily assembled/disassembled casing of a thin electronic product at a lower cost and to increase economic added value is an important topic in various fields.

SUMMARY

One embodiment of this disclosure provides an electronic device including a casing and an electrical component. The casing includes a first casing body, a second casing body and a fastener. The second casing body is located on the first casing body, and the fastener detachably clamps a side of the first casing body and the second casing body. The electrical component is located between the first casing body and the second casing body.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details.

In addition, one or more embodiments of the disclosure are illustrated in the drawings, and some practice details used in the following paragraphs should not be overly explained or limiting the disclosure but should be read on the meaning commonly used in the related fields.

In other instances, well-known structures and devices are schematically shown in order to simplify the drawing, and their size, proportion, gap, and angle may be exaggerated for illustrative purposes, but the present disclosure is not limited thereto, and various modifications are allowed and can be made according to the following disclosure as long as it does not depart from the spirit of the present disclosure. Note that the actual size and designs of the product manufactured based on the present disclosure may also be modified according to any actual requirements.

Further, the terms, such as "end", "portion", "part", "area" and the like may be used in the following to describe specific components and structures or specific features thereon or therebetween, but are not intended to limit these components and structures. In the following, it may use terms, such as "substantially", "approximately" or "about"; when these terms are used in combination with size, concentration, temperature or other physical or chemical properties or characteristics, they are used to express that, the deviation existing in the upper and/or lower limits of the range of these properties or characteristics or the acceptable tolerances caused by the manufacturing tolerances or analysis process, would still able to achieve the desired effect.

Furthermore, unless otherwise defined, all the terms used in the disclosure, including technical and scientific terms, have their ordinary meanings that can be understood by those skilled in the art. Moreover, the definitions of the above terms are to be interpreted as being consistent with the technical fields related to the disclosure. Unless specifically defined, these terms are not to be construed as too idealistic or formal meanings. The terms of the components in the disclosure are sometimes referred to in a more concise manner, depending on the requirements of the description, and should be understood by the reader.

Figure 1:
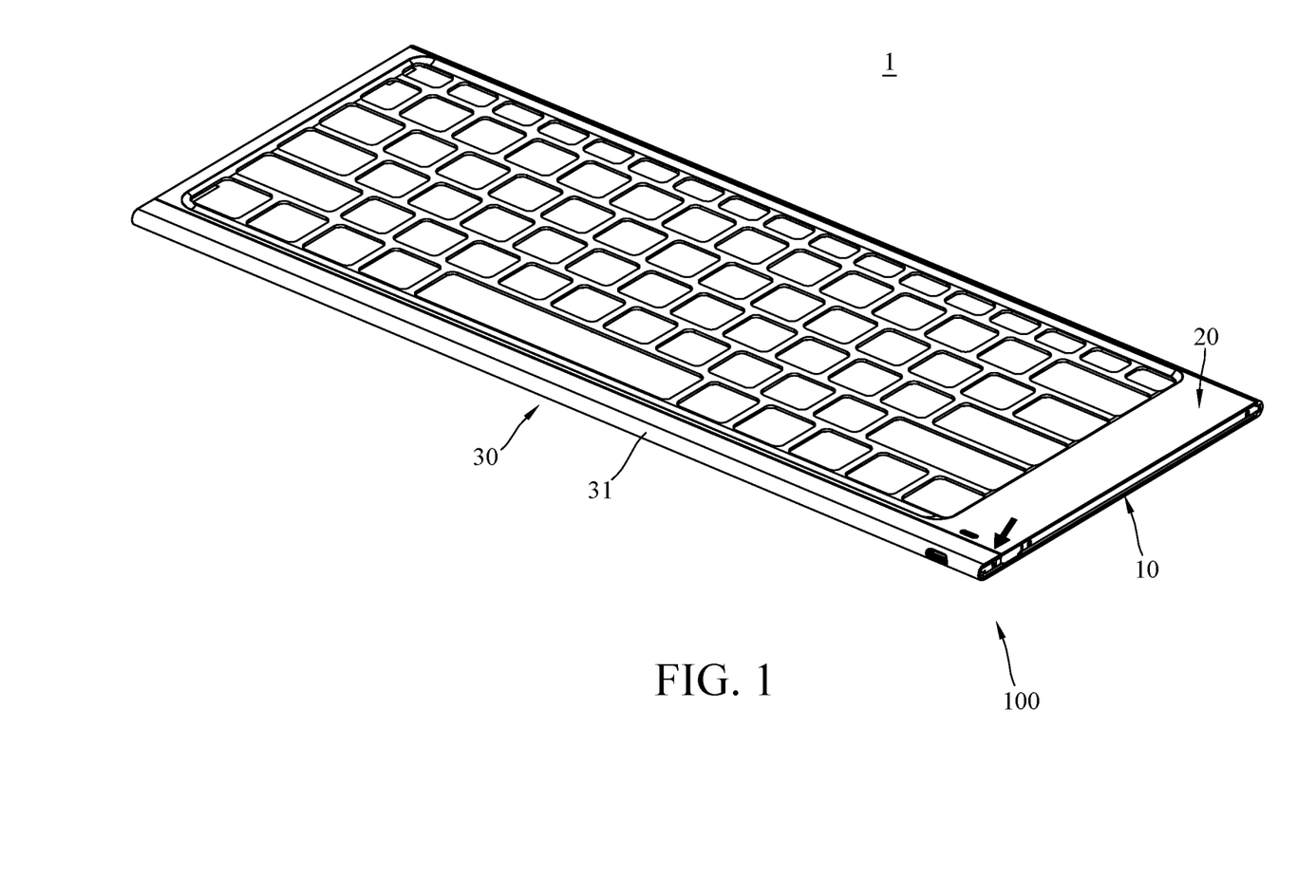
FIG. 1 is a perspective view of an electronic device according to one embodiment of the disclosure.

Firstly, referring to FIG. 1, a perspective view of an electronic device 1 according to one embodiment of the disclosure is provided. This embodiment provides a casing 100 configured for the electronic device 1. The electronic device 1 is, but not limited to, an input device, such as a thin keyboard, and can be, but not limited to, a wire-connected or wireless keyboard. It is noted that the thin keyboard is an exemplary application and form of the casing 100 of the embodiment for the purpose of easier comprehension of the disclosure; however, the disclosure is not restricted to be applied to the field of thin keyboard or any particular field. In addition, for the purpose of simple illustration, the keys and most of electrical components of the thin keyboard are omitted from the drawing.

As shown in FIG. 1, the casing 100 includes a first casing body 10, a second casing body 20, and a fastener 30. Specifically, in this embodiment, the first casing body 10 and the second casing body 20 are, for example, plate-like objects, and the second casing body 20 is arranged on a side of the first casing body 10. It is noted that the first casing body and the second casing body can be directly or indirectly placed onto each other and they can be parallel or not parallel relative to each other. The fastener 30 is configured to be disposed at the same side of the first casing body 10 and the second casing body 20 so as to secure the positions of the first casing body 10 and the second casing body 20. In this embodiment, the fastener 30 is configured to clamp and cover part of the same side of the first casing body 10 and the second casing body 20 so as to fix the first casing body 10 and the second casing body 20 together. In the case that the electronic device 1 of the embodiment is a thin keyboard, the first casing body 10 can be the part of the thin keyboard for supporting the second casing body 20 and being placed on desk or any suitable flat surface, and the second casing body 20 is the part of the thin keyboard for the arrangement of keys. Therefore, during the normal use of the electronic device 1, the first casing body 10 can be considered as a lower enclosure of the casing 100, and the second casing body 20 can be considered as an upper enclosure of the casing 100.

The fastener 30 is, but not limited to, made of the same/similar material to the first casing body 10 and/or second casing body 20. In some embodiments, the fastener 30 and the first casing body and/or second casing body 20 may be made of different materials. In this embodiment or some other embodiments, the fastener 30 is, for example, made of any suitable plastic material that is at a lower cost than alternatives and has great mechanical strength to restrain the first casing body 10 and the second casing body 20 and prevent them from being separated while also having a certain degree of deformability to facilitate various operations of the fastener 30.

In addition, changing the color and/or texture of the fastener 30 can be easily implemented during the manufacturing process, such that the fastener 30 can easily obtain a color, texture or surface condition different from the first casing body 10 and the second casing body 20. This allows the casing 100 to have a rich color combination or various visual elements to create an aesthetic-appearing appearance. For example, in this embodiment and some other embodiments, the fastener 30 has a decorative surface 31, the decorative surface 31 is opposite the first casing body 10 and the second casing body 20 and can be considered as the outer surface of the fastener 30, and, during the manufacturing process, the decorative surface 31 can be painted a color other than that of the first casing body 10 and the second casing body 20 or can be formed with a flat solid feature, flat pattern or hollow pattern on its surface to obtain different visual styles of the casing 100 while not affecting the structural strength of the fastener 30, but the disclosure is not limited thereto.

Further, the fastener 30 is, but not limited to, a long bar-like object, but the disclosure is not limited thereto. For example, in some embodiments, the fastener may be shorter than the fastener 30 shown in FIG. 1. Moreover, it is noted that the quantity of the fastener on the same side of the first casing body and the second casing body is not particularly restricted; for example, in another embodiment, there may be plural shorter fasteners installed at the same side of the first casing body and the second casing body.

Figure 2:
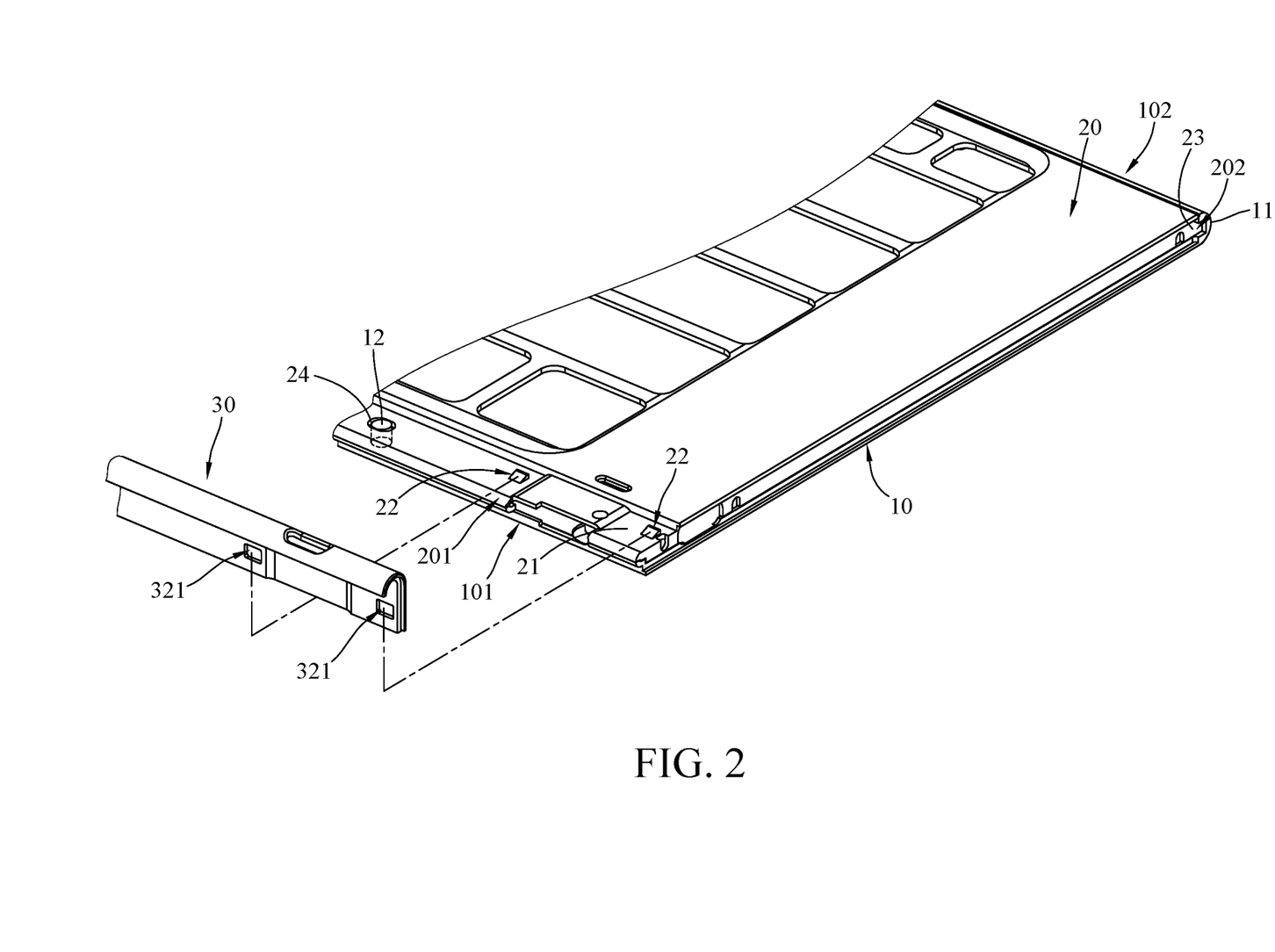
FIG. 2 is a partial enlarged exploded view of the electronic device in FIG. 1.
Figure 3:
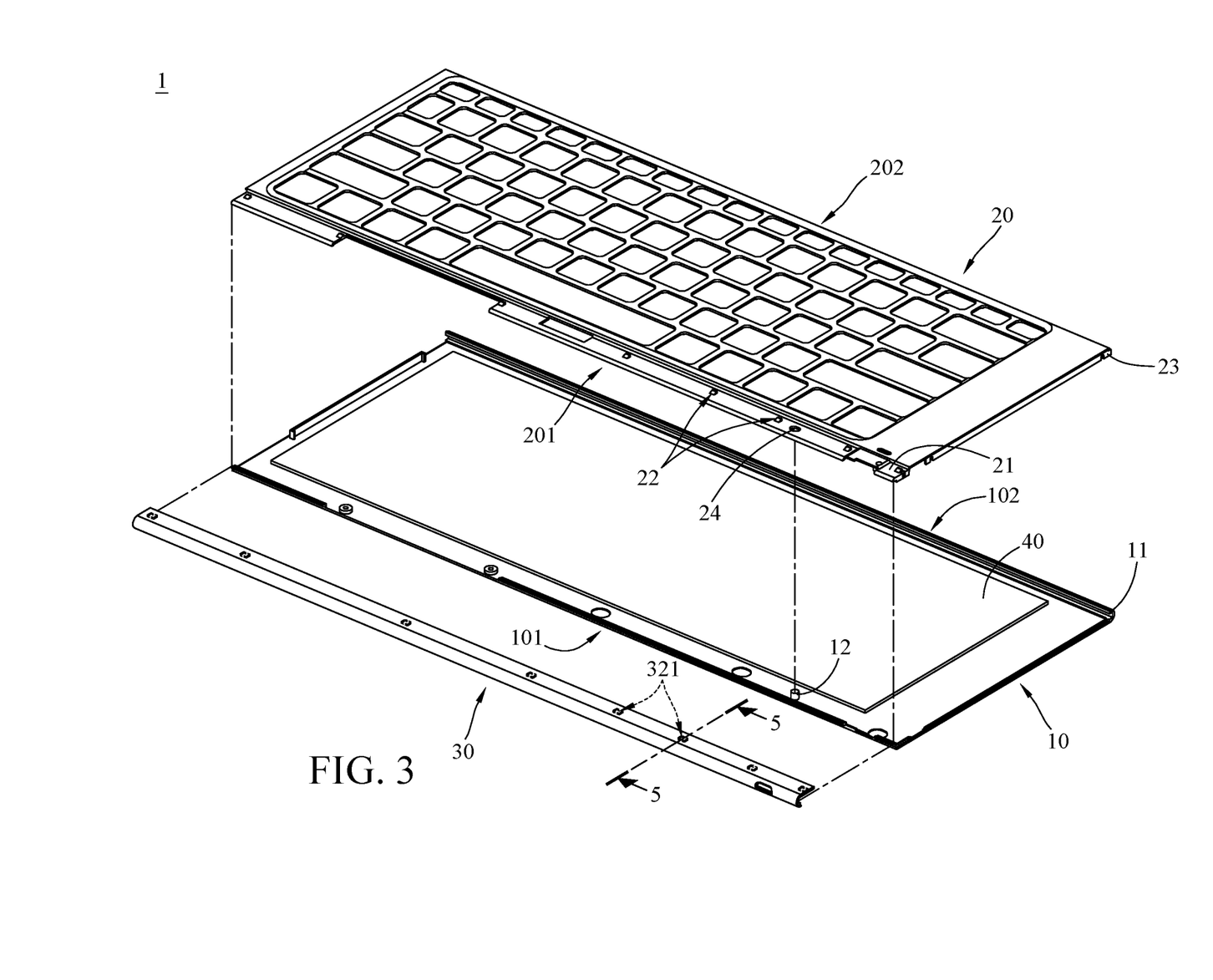
FIG. 3 is a further exploded view of the electronic device in FIG. 1.
Figure 4:
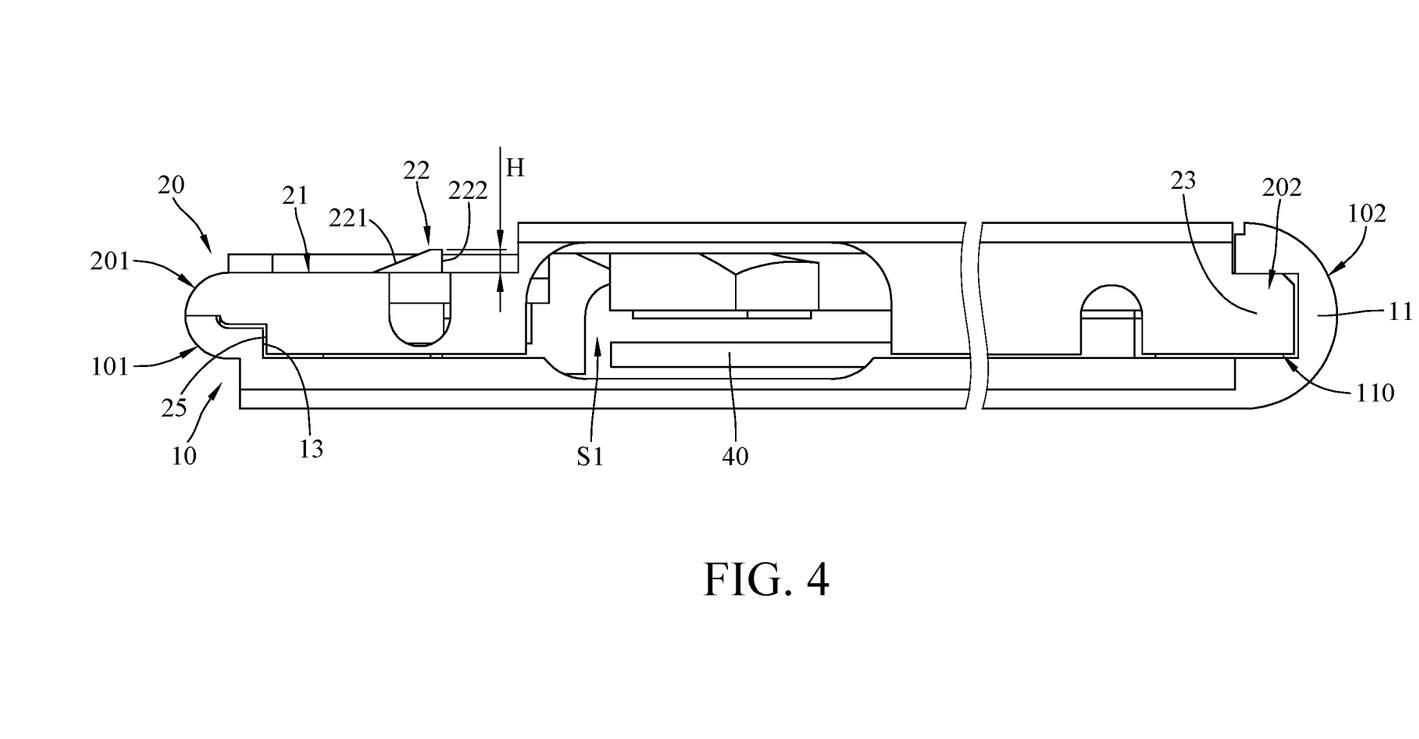
FIG. 4 is a partial enlarged side view of the electronic device in FIG. 2.

Then, please further refer to FIGS. 2-5 to illustrate the details of the first casing body 10, the second casing body 20 and the fastener 30, where FIG. 2 is a partial enlarged exploded view of the electronic device 1 in FIG. 1, FIG. 3 is a further exploded view of the electronic device 1 in FIG. 1, and FIG. 4 is a partial enlarged side view of the electronic device 1 in FIG. 2.

Firstly, in this embodiment and some other embodiments, the first casing body 10 has a first side 101 and a second side 102 opposite to each other, where the first side 101 and the second side 102 of the first casing body 10 respectively are the edges indicated by the arrows of the labels 101 and 102 and the peripheral areas adjacent to these edges but not restricted to be these edges. Also, in this embodiment or some other embodiments, the first casing body 10 further has a first casing body assembling portion 11, and the first casing body assembling portion 11 is located at the second side 102 of the first casing body 10 and is configured to be assembled with the second casing body 20. Specifically, referring to FIG. 4, the first casing body assembling portion 11 is, for example, a hook structure that forms an assembling slot 110 at the inner side of the first casing body 10.

In this embodiment and some other embodiments, the second casing body 20 has a first side 201 and a second side 202 opposite to each other; in addition, the second casing body 20 further has an outer surface 21 facing away from the first casing body 10. The first side 201 and the second side 202 of the second casing body 20 respectively are the edges indicated by the arrows of the labels 201 and 202 and the peripheral areas adjacent to these edges but not restricted to be these edges. The outer surface 21 is generally denoted to a surface of the continuous and non-continuous structure on the side of the second casing body 20 opposite to the first casing body 10. In this embodiment or some other embodiments, the second casing body 20 further has at least one first engagement structure 22 and a second casing body assembling portion 23. The first engagement structure 22 is located on the outer surface 21 of the second casing body 20; specifically, the first engagement structure 22 protrudes from the outer surface 21 of the second casing body 20 and is located adjacent to the first side 201 of the second casing body 20. Further, as shown in FIG. 4, in this embodiment, the first engagement structure 22 has an inclined guiding surface 221 and an engaging surface 222; specifically, the inclined guiding surface 221 substantially faces toward the first side 201 of the second casing body 20, and the engaging surface 222 substantially faces toward the second side 202 of the second casing body 20. In other words, the inclined guiding surface 221 and the engaging surface 222 are two surfaces of the first engagement structure 22 that do not face each other but are respectively facing toward different or opposite directions. Furthermore, from the viewpoint of FIG. 4, the engaging surface 222 is substantially perpendicular to the outer surface 21 of the second casing body 20, and the inclined guiding surface 221 is neither parallel to the engaging surface 222 nor to the outer surface 21. In this embodiment, the inclined guiding surface 221 is at an obtuse angle to the outer surface 21, and the purpose of the inclined guiding surface 221 will be illustrated in later paragraphs. The second casing body assembling portion 23 is located at the second side 202 of the second casing body 20 and is sized to be inserted into the assembling slot 110 of the first casing body assembling portion 11 of the first casing body 10 so that the second casing body 20 can be temporally fixed to the first casing body 10.

Herein, the first casing body assembling portion 11 and the second casing body assembling portion 23 are a protrusion and a mating recess, and, in some other embodiments, their structures can be swapped with each other. For example, in some embodiments, the second casing body assembling portion of the second casing body can be a hook structure having a recess similar to the first casing body assembling portion 11 of the previous embodiment, and the first casing body assembling portion of the first casing body can be a mating protrusion similar to the second casing body assembling portion 23 of the previous embodiment. Note that any other designs suitable for assembling the same side of the first casing body and the second casing body can be implemented as the first casing body assembling portion and the second casing body assembling portion of the disclosure so that the shapes of the first casing body assembling portion and the second casing body assembling portion and how they are assembled are not particularly restricted. Furthermore, the first casing body and the second casing body of the disclosure are not restricted to be directly assembled to each other. For example, in some other embodiments, the first casing body and the second casing body are assembled to each other in an indirect contact manner; in such a case, the first casing body assembling portion and the second casing body assembling portion can be arranged in a way having a third component located therebetween; that is, the first casing body assembling portion and the second casing body assembling portion can be arranged in position by being arranged on the third component.

In addition, the first casing body 10 has at least one first positioning structure 12 protruding from a side of the first casing body 10 facing the second casing body 20, and the second casing body 20 has at least one second positioning structure 24 formed on the outer surface 21 and sized for the insertion of the first positioning structure 12. When the second casing body 20 is stacked on the first casing body 10, the first positioning structure 12 of the first casing body 10 is removably inserted into the second positioning structure 24 of the second casing body 20 so as to position the first casing body 10 and the second casing body 20 to a predetermined assembly position relative to each other.

Herein, the first positioning structure 12 and the second positioning structure 24 are a protrusion and a mating hole, and, in some other embodiments, their structures can be swapped with each other. For example, in some embodiments, the first positioning structure of the first casing body can be a hole similar to the second positioning structure 24 of the previous embodiment, and the second positioning structure of the second casing body can be a mating protrusion similar to the first positioning structure 12 of the previous embodiment. In short, one of the first positioning structure of the first casing body and the second positioning structure of the second casing body is a protrusion, and the other is a mating hole. Note that any other designs suitable for positioning the first casing body and the second casing body can be implemented as the first positioning structure and the second positioning structure of the disclosure so that the shapes, positions and quantities of the first positioning structure and the second positioning structure and how they are engaged with each other are not particularly restricted. Further, the first positioning structure and second positioning structure can be optional; in some embodiments, the first casing body and the second casing body may not have the aforementioned first positioning structure and second positioning structure.

Figure 7:
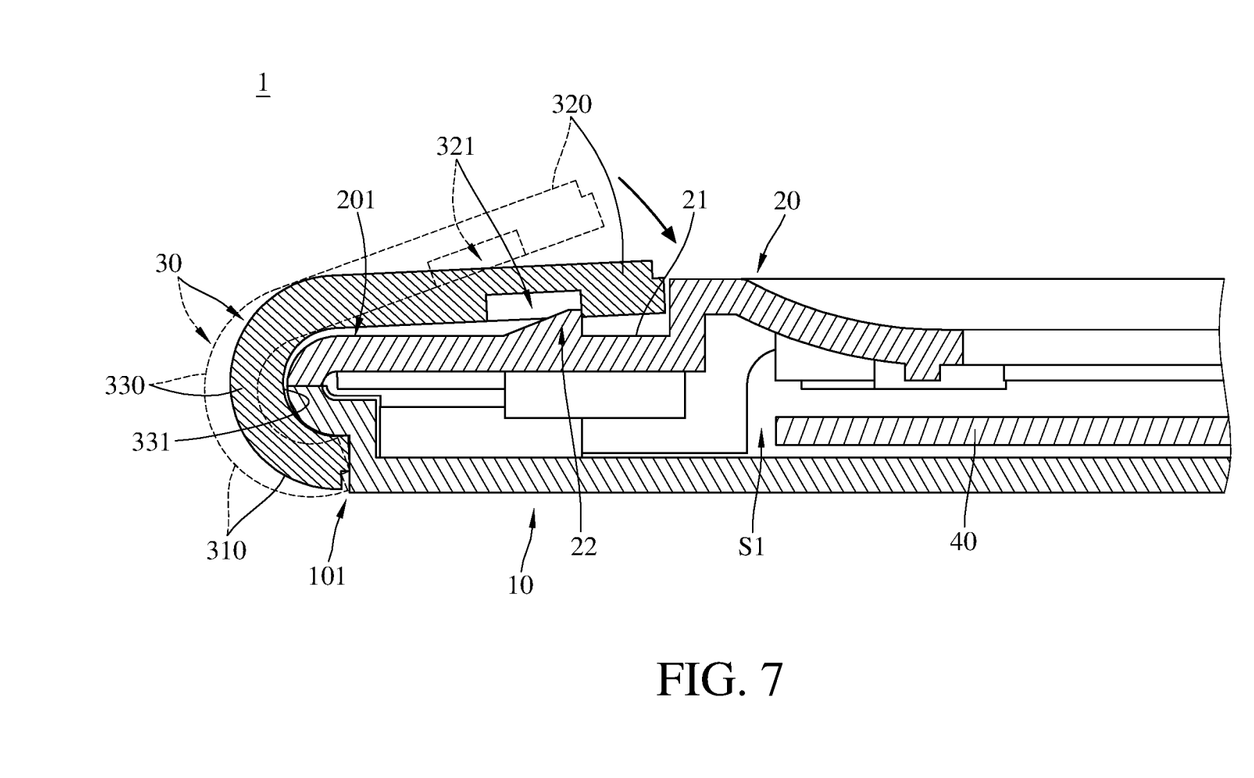
FIG. 7 illustrates the installation of the fastener in FIG. 1.
Figure 9:
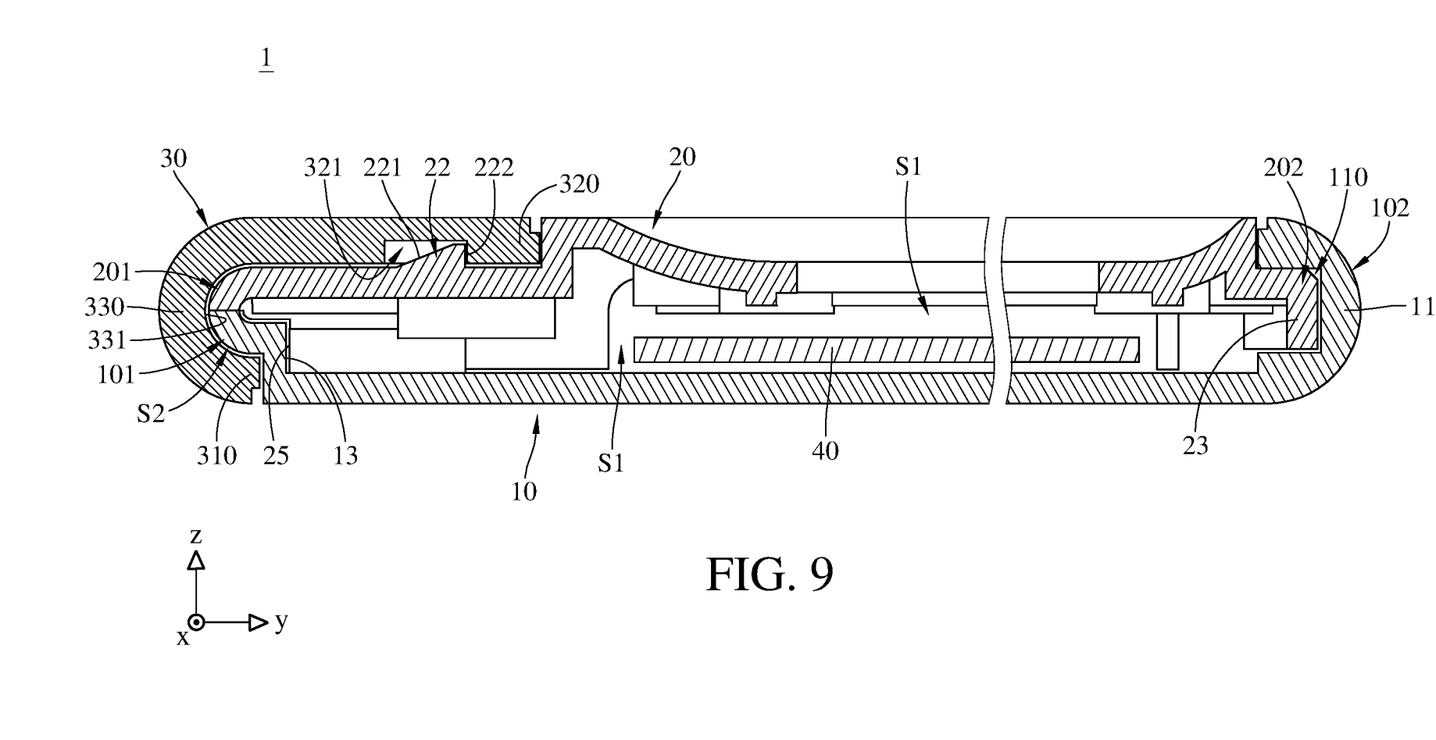
FIG. 9 is a partial enlarged cross-sectional side view of the electronic device in FIG. 1.

When the second casing body 20 is stacked on the first casing body 10, the first casing body 10 and the second casing body 20 together form an accommodation space S1 (as shown in FIG. 4, FIG. 7 or FIG. 9) therebetween. The accommodation space S1 is configured to accommodate one or more required electrical components that are able to achieve or provide the required functions of the electronic device 1. For example, there is an electrical component 40 located between the first casing body 10 and the second casing body 20 as shown in FIG. 3 or FIG. 4, and the electrical component 40 is, but not limited to, a circuit board. It is noted that the type and quantity of the electrical components accommodated in the electronic device of the disclosure are not particularly restricted and can be changed according to the required functions and application of the electronic device.

In addition, as shown in FIG. 4, the first casing body 10 further has at least one first stop surface 13, and the second casing body 20 further has at least one second stop surface 25. In more detail, the first stop surface 13 of the first casing body 10 substantially faces toward the first side 101 of the first casing body 10, and the second stop surface 25 of the second casing body 20 substantially faces toward the first side 201 of the second casing body 20. Therefore, when the second casing body 20 is stacked on the first casing body 10 in the predetermined position, the first stop surface 13 of the first casing body 10 faces and corresponds to the second stop surface 25 of the second casing body 20. As such, the first stop surface 13 and the second stop surface 25 are able to stop the first casing body 10 from moving toward the second side 202 of the second casing body 20 and stop the second casing body 20 from moving toward the first side 101 of the first casing body 10.

Figure 5:
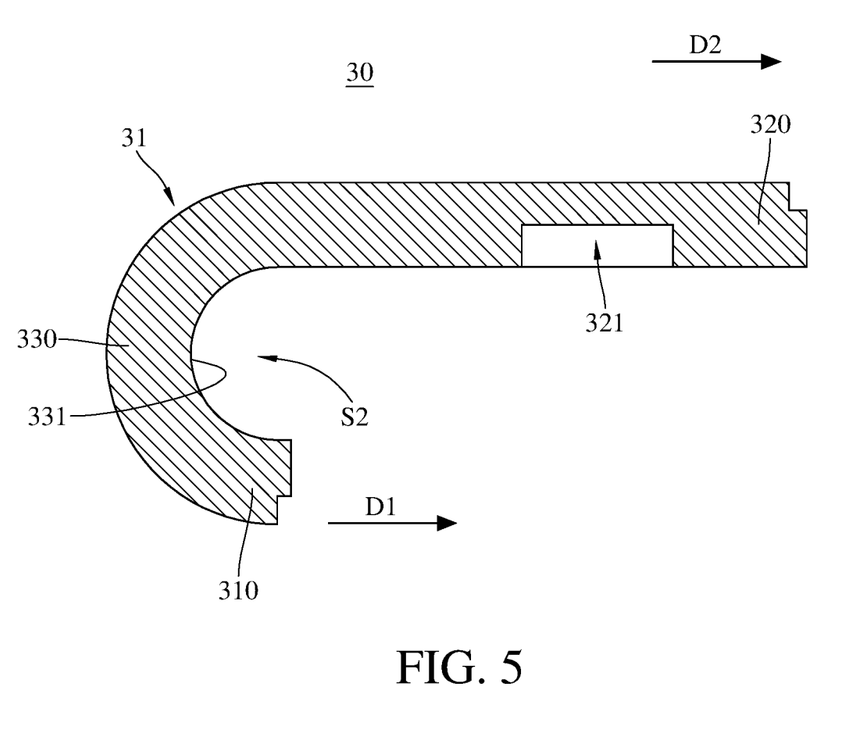
FIG. 5 is an enlarged cross-sectional side view of a fastener in FIG. 2.

Then, please refer to FIG. 2 and further refer to FIG. 5, where FIG. 5 is an enlarged side view of the fastener 30 in FIG. 2. In this embodiment or some other embodiments, the fastener 30 includes a first extension portion 310, a second extension portion 320, and a connection portion 330. The first extension portion 310 is connected to the second extension portion 320 via the connection portion 330; that is, the connection portion 330 is connected to and located between the first extension portion 310 and the second extension portion 320. As shown in FIG. 5, the first extension portion 310, the second extension portion 320 and the connection portion 330 together form a clamping space S2 therebetween. The connection portion 330 has an arc surface 331. The clamping space S2 is configured to accommodate and clamp the first side 101 of the first casing body 10 and the first side 201 of the second casing body 20. In this embodiment or some other embodiments, the fastener 30 is made of a single piece, but the disclosure is not limited thereto.

Further, as shown in FIG. 5, the connection portion 330 is in curved shape, such as in a C shape from the viewpoint of FIG. 5, and the first extension portion 310 and the second extension portion 320 extends outward from different parts of the connection portion 330. Due to the material property of the fastener 30, the first extension portion 310 and/or the second extension portion 320 are able to be bent relative to the connection portion 330 when a certain amount of force is applied on the first extension portion 310 and/or the second extension portion 320.

In this embodiment or some other embodiments, defining a first extension direction D1 of the first extension portion 310 and a second extension direction D2 of the second extension portion 320, where the first extension direction D1 is substantially parallel to the second extension direction D2. In addition, the amount of the first extension portion 310 protruding from the connection portion 330 is less than that of the second extension portion 320 protruding from the connection portion 330. However, the disclosure is not limited to the shape of the fastener 30. For example, in some embodiments, the amount of the first extension portion protruding from the connection portion may be larger than or equal to that of the second extension portion protruding from the connection portion, and the first extension direction of the first extension portion may be at an acute angle to the second extension direction of the second extension portion so that the first extension direction and the second extension direction are not parallel to each other; in such a case, the distance between the first extension portion and the second extension portion gradually decreases from the connection portion toward a direction away from the connection portion.

In addition, in this embodiment or some other embodiments, the second extension portion 320 has at least one second engagement structure 321, and the first engagement structure 22 on the outer surface 21 of the second casing body 20 is configured to be detachably engaged with the second engagement structure 321. In this embodiment, the first engagement structure 22 of the second casing body 20 is a protrusion protruding outwards from the outer surface 21 of the second casing body, and the second engagement structure 321 of the second extension portion 320 of the fastener 30 is a recess and, in some other embodiments, their structures can be swapped with each other. For example, in some embodiments, the first engagement structure of the second casing body can be a recess similar to the second engagement structure 321 of the previous embodiment, and the second engagement structure of the fastener can be a mating protrusion similar to the first engagement structure 22 of the previous embodiment. In short, one of the first engagement structure of the second casing body and the second engagement structure of the fastener is a protrusion, and the other is a mating recess. Note that any other designs suitable can be implemented as the first engagement structure and the second engagement structure of the disclosure so that the shapes, positions and quantities of the first engagement structure and the second engagement structure and how they are engaged with each other are not particularly restricted can be modified or changed according to actual requirements. For example, in another embodiment, the first engagement structure 22 may be a bump having at least one continuous curved outer surface. Further, the first engagement structure and the second engagement structure can be optional; in some embodiments, the second casing body and the fastener may not have the aforementioned first engagement structure and second engagement structure.

Figure 6:
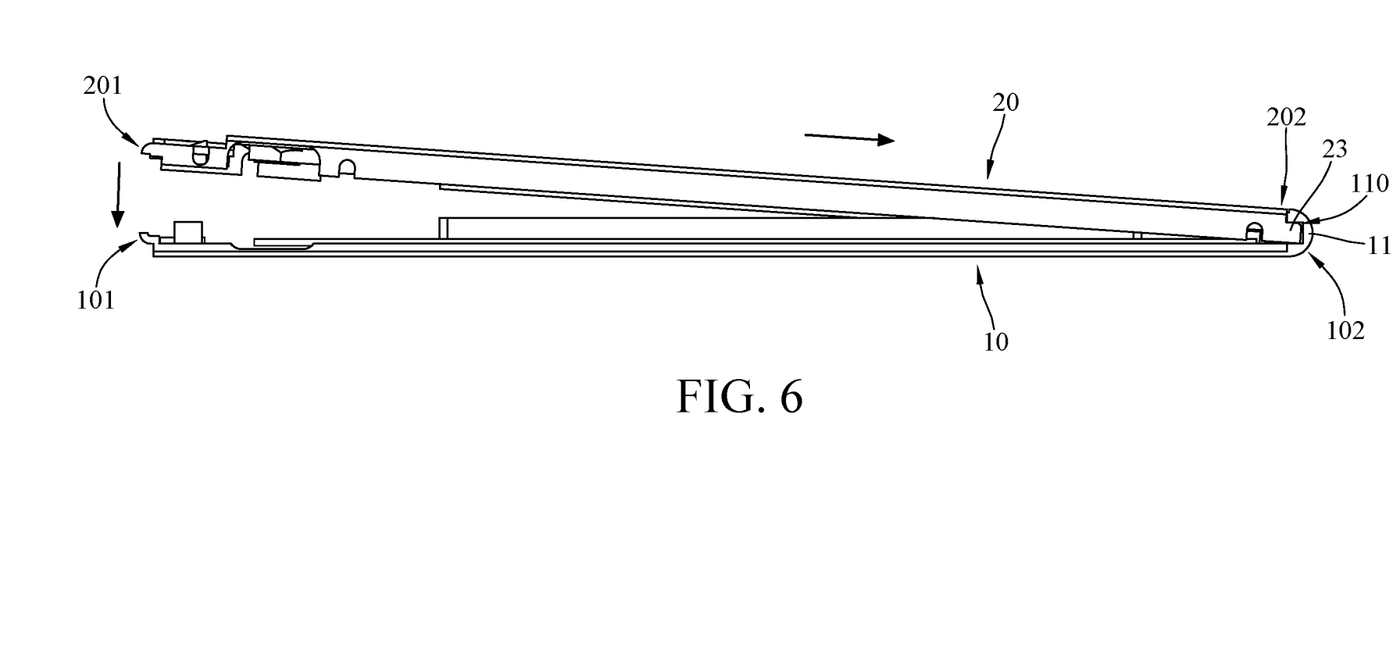
FIG. 6 illustrates the assembly process of a first casing body and a second casing body in FIG. 1.
Figure 8:
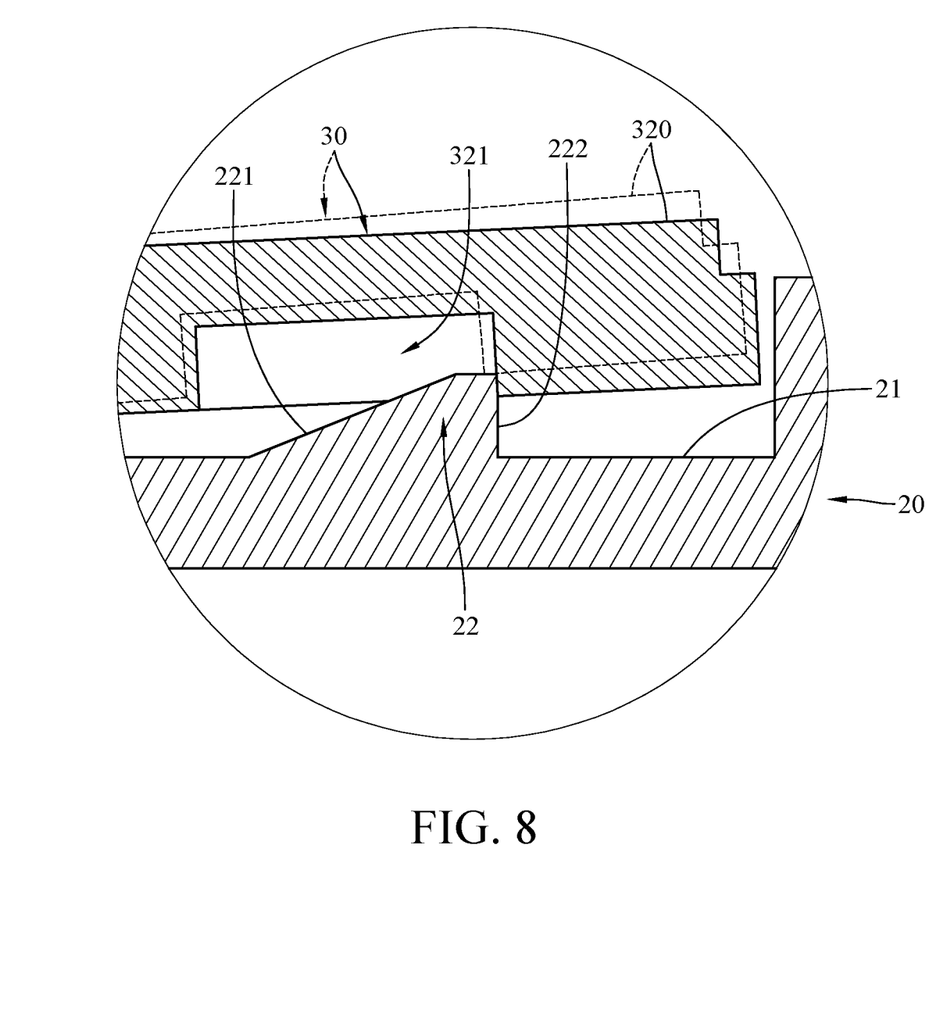
FIG. 8 is a partial enlarged view of FIG. 7.

Then, further referring to FIGS. 6-9, the assembly process of the first casing body 10, the second casing body 20 and the fastener 30 of the casing 100 is provided, where FIG. 6 illustrates the assembly process of the first casing body 10 and the second casing body 20 in FIG. 1, FIG. 7 illustrates the installation of the fastener 30 in FIG. 1, FIG. 8 is a partial enlarged view of FIG. 7, and FIG. 9 is a partial enlarged cross-sectional side view of the electronic device 1 in FIG. 1.

Firstly, as shown in FIG. 6, the second casing body assembling portion 23 at the second side 202 of the second casing body 20 can be inserted into the assembling slot 110 of the first casing body assembling portion 11 at the second side 102 of the first casing body 10, and then the second casing body 20 can be pivoted and stacked on the first casing body 10 as the second casing body assembling portion 23 serves as a pivot point. During this step, the second side 202 of the second casing body 20 can be considered as able to be detachably and pivotally disposed on the second side 102 of the first casing body 10. When the second casing body 20 is pivoted to the predetermined position, the first side 101 of the first casing body 10 is arranged on the first side 201 of the second casing body 20, as shown in FIG. 4. At this moment, the second casing body 20 is removably stacked on the first casing body 10; meanwhile, the first positioning structure 12 of the first casing body 10 is inserted into the second positioning structure 24 of the second casing body 20 so as to position the first casing body 10 and the second casing body 20 in predetermined assembly position.

Then, as the arrow shown in FIG. 7, the fastener 30 is installed on the first side 101 of the first casing body 10 and the first side 201 of the second casing body 20 so as to detachably clamp the first side 101 and the first side 201. Specifically, the first extension portion 310 of the fastener 30 can be placed against the first side 101 of the first casing body 10, and then the fastener 30 can be pivoted to let the connection portion 330 to contact the first side 101 of the first casing body 10 and the first side 201 of the second casing body 20 and to let the second extension portion 320 to cover part of the outer surface 21 of the second casing body 20. By doing so, the arc surface 331 of the connection portion 330 simultaneously clamps the first side 101 of the first casing body 10 and the first side 201 of the second casing body 20. During this step, referring to FIG. 8, the second engagement structure 321 of the second extension portion 320 can be engaged with the first engagement structure 22 on the outer surface 21 of the second casing body 20. In more detail, when the second extension portion 320 of the fastener 30 just touches the first engagement structure 22, the second engagement structure 321 of the second extension portion 320 may have an interference with the engaging surface 222 of the first engagement structure 22, therefore it may require to additionally apply a certain amount of force to deform the second extension portion 320 of the fastener 30 to eliminate such interference to force the second extension portion 320 to engage with the engaging surface 222. In the case that the casing 100 is in a form of thin keyboard, the aforementioned interference may be approximately 0.1 millimeters, and the engaging surface 222 of the first engagement structure 22 of the second casing body 20 may have a height H of approximately 0.3 millimeters, and such configuration can ensure that the second engagement structure 321 of the fastener 30 will not be easily disengaged from the first engagement structure 22 of the second casing body 20.

When the second engagement structure 321 of the fastener 30 is engaged with the first engagement structure 22, the assembly process of the casing 100 is completed. At this moment, as shown in FIG. 9, the first side 101 of the first casing body 10 and the first side 201 of the second casing body 20 are clamped and covered by the clamping space S2 of the fastener 30 so as to be restrained and held in position. Specifically, the first extension portion 310 and the second extension portion 320 of the fastener 30 are respectively located at two opposite surfaces of the first casing body 10 and the second casing body 20 so that the fastener 30 can prevent the first side 101 of the first casing body 10 and the first side 201 of the second casing body 20 from moving away from each other along the direction of Z-axis. Meanwhile, the second engagement structure 321 of the fastener 30 is engaged with the engaging surface 222 of the first engagement structure 22, the second side 102 of the first casing body 10 and the second side 202 of the second casing body 20 are assembled to each other via the first casing body assembling portion 11 and the second casing body assembling portion 23, and the first stop surface 13 of the first casing body 10 faces and corresponds to the second stop surface 25 of the second casing body 20. In such a case, the first casing body 10 and the second casing body 20 are prevented from moving relative to each other along the directions of the axes X, Y, Z, such that the first casing body 10 and the second casing body 20 are stably maintained in the current status. It is noted that the aforementioned installation process of the fastener 30 is exemplary, in some cases, the fastener 30 can be directly installed onto the first side 101 of the first casing body 10 and the first side 201 of the second casing body 20 in a single step of being moved along the direction of Y-axis. During this step, the second extension portion 320 of the fastener 30 is deformed by the first engagement structure 22 of the second casing body 20 when it contacts and moves along the inclined guiding surface 221 of the first engagement structure 22, and then the second engagement structure 321 engages with the engaging surface 222 after it passes over the first engagement structure 22.

In addition, in the embodiment that the distance between the first extension portion and the second extension portion gradually decreases from the connection portion toward a direction away from the connection portion, the first extension portion and the second extension portion help to improve the restraining force of the fastener to the first casing body and the second casing body.

In short, the assembly process of the casing 100 only includes stacking the first casing body 10 and the second casing body 20 of the casing 100 and directly installing the fastener 30 at one side of the casing 100. Therefore, the assembly process of the casing 100 is simple and convenient, and which facilitates to improve the assembly efficiency and decrease the assembly error-rate. As a result, the overall time for assembling the casing 100 can be reduced.

On the other hand, to remove the fastener 30, the user can simply insert any handy flat or pointy object, such as finger, paper sheet or plastic sheet into the gap between the fastener 30 and second casing body 20 to pry a corner of the fastener 30 from the second casing body 20 (as the thick arrow shown in FIG. 1) and then move the object along the extension direction of the fastener 30 to sequentially disengage the second engagement structures 321 of the fastener 30 from the first engagement structures 22 on the outer surface 21 of the second casing body 20. By doing so, the fastener 30 can be pivoted back to the position shown in the dotted line in FIG. 7 so that the second extension portion 320 of the fastener 30 can be moved to an inclined position relative to the second casing body 20. At this moment, the fastener 30 can be removed to allow the first casing body 10 and the second casing body 20 to be separated from each other. Therefore, the disassembly process of the casing 100 can be implemented simply by prying the fastener 30 so that the disassembly process is also simple and convenient and able to improve the efficiency of the maintenance process of the electronic device 1. Also, due to the simple installation and removal steps of the fastener 30, it would be easy for the user to manually change the fastener 30 of different colors or designs according to their preferences.

In comparison with the conventional techniques that the parts of a casing are fixed to each other by using adhesive or screws, the electronic device 1 of the embodiment is more efficient in assembly/disassembly process and can be manufactured at a lower cost. Unlike the casing bodies of a conventional thin electronic product that must have a larger thickness for the firm engagement with the screws or require a larger internal space for the arrangement of hooking structures, the thicknesses of the first casing body 10 and the second casing body 20 and the internal space therebetween can be relatively small so that the overall thickness of the casing 100 is small and thus making the electronic device 1 satisfy the demands for thin and compact electronic products.

As discussed above, the fastener of the disclosure can also be applied to any other electronic or non-electronic products that have two casing bodies to be assembled together. For example, other than the keyboard, in some embodiments, the fastener of the disclosure may also be used to fix the front and back casing bodies of a display; in such a case, the aforementioned features of the first casing body and the second casing body that cooperate with the fastener can be applied to the front and back bodies of the display. Similarly, the fastener also can help to reduce the overall thickness of the display casing and achieve simple and convenient assembly and disassembly processes.

In short, with the cooperation of the fastener, the first casing body and the second casing body, a thin and easily assembled/disassembled electronic product can be implemented at a relatively low manufacturing cost, and the electronic product can have various different color combinations to increase the economic value added.

However, the aforementioned casing and electronic device are exemplary and the disclosure is not limited thereto. For example, in some embodiments, the casing may omit the first casing body assembling portion 11 and the second casing body assembling portion 23; in such a case, the second sides of the first casing body and the second casing body may be in shape the same as or similar to that of the first sides of the first casing body and the second casing body so that another fastener same as or similar to the aforementioned fastener 30 can be installed on the second sides of the first casing body and the second casing body, that is, the first sides and the second sides of the first casing body and the second casing body are fixed and held by the fasteners, in other words, two opposite sides of the first casing body and the second casing body are both fixed and held by the fasteners.

In addition, how the fastener, the first casing body and the second casing body are assembled together can be modified and not particularly restricted. For example, referring to FIG. 10, a part of an electronic device according to another embodiment of the disclosure is illustrated. Note that the same reference number indicates the same component. This embodiment provides an electronic device 1', and the main difference between the electronic device 1' and the previous electronic devices is the engagement manner between the fastener and the second casing body so that only such difference is described hereinafter and those same as the previous embodiments can be referred to the previous paragraphs and will not be described.

Figure 10:
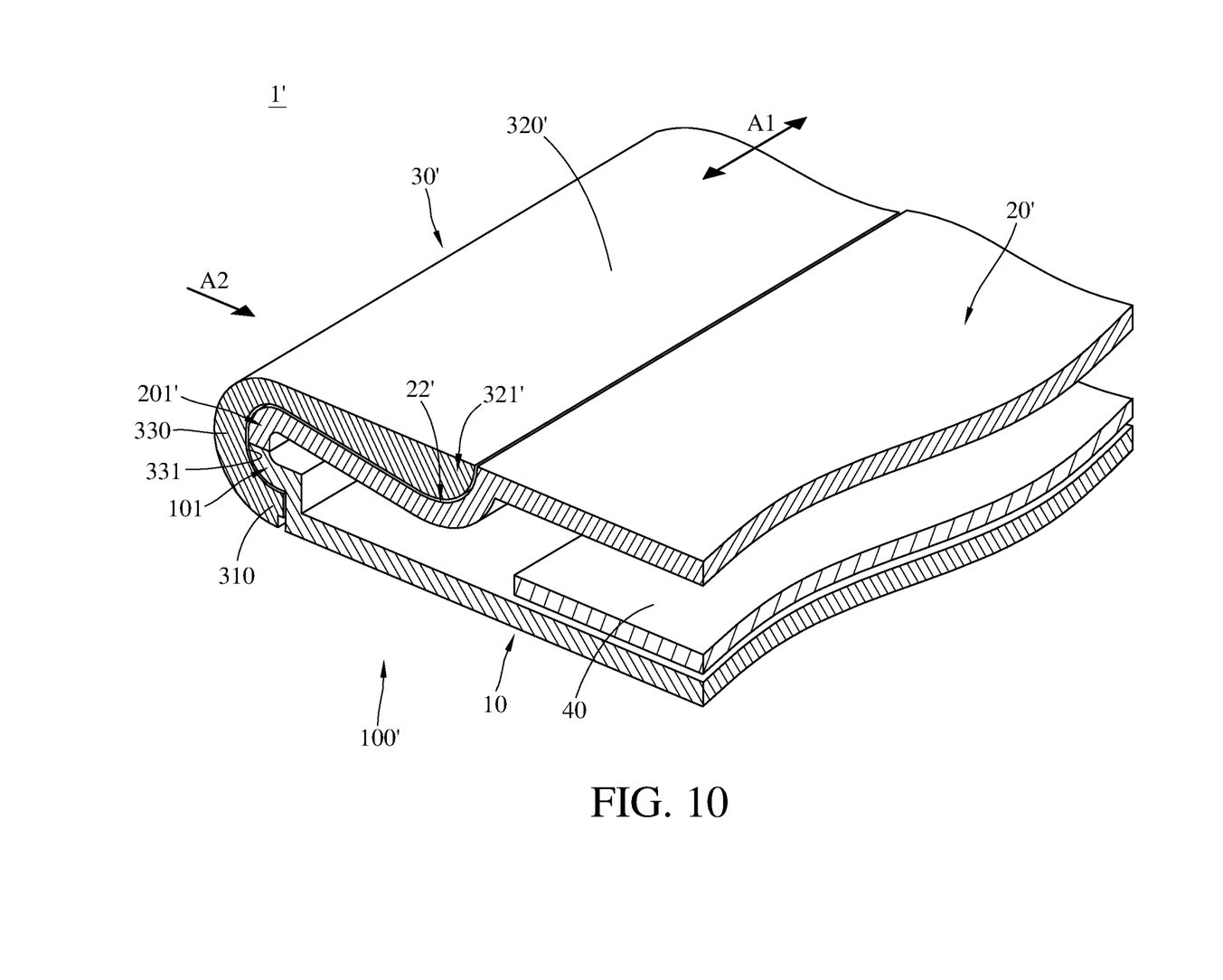
FIG. 10 illustrates a part of an electronic device according to another embodiment of the disclosure.

As shown in FIG. 10, in this embodiment, the electronic device 1' has a casing 100', the casing 100' includes a first casing body 10, a second casing body 20' and a fastener 30'. The difference between this and previous embodiments is that a first engagement structure 22' of the second casing body 20' is a long recess having the same length as that of the second casing body 20', and a second engagement structure 321' of a second extension portion 320' of the fastener 30' is a mating long protrusion extending along the length of the fastener 30', that is, the first engagement structure 22' and the second engagement structure 321' extend from one side of the casing 100' to the other; in other words, the first engagement structure 22' and the second engagement structure 321' are continuous structures extending from one side of the casing 100' to the other. In such a case, the fastener 30' can be engaged with the first engagement structure 22' at a side of the first casing body 10 and the second casing body 20' and moved along a direction of arrow A1. By doing so, the second engagement structure 321' of the fastener 30' can be gradually inserted into the first engagement structure 22' to complete the installation of the fastener 30' on the first casing body 10 and the second casing body 20'. Alternatively, the fastener 30' can be directly installed onto the first side 101 of the first casing body 10 and a first side 201' of the second casing body 20' in a single step of being moved along the direction of arrow A2. During this process, the second engagement structure 321' of the fastener 30' is deformed by the first side 201' of the second casing body 20' and then slides into the first engagement structure 22'. In addition, a side of the first casing body 10 and/or second casing body 20' may have a stopping structure (not shown) for stopping the fastener 30' as the fastener 30' reaches the predetermined position.

According to the electronic device of the embodiments discussed above, since the side of the first casing body and the second casing body can be directly fixed by the fastener, the assembly/disassembly processes of the electronic device are simple and convenient and thereby improving the assembly/disassembly efficiency, shortening the overall time for assembling/disassembling the electronic device and decreasing the assembly error-rate.

In comparison with the conventional techniques that use adhesive, screws or internal hooking structures to fix the parts of the casing, the first casing body and the second casing body of the embodiments can be directly assembled by the fastener so that the electronic device of the disclosure can be assembled/disassembled in a simple and convenient manner and implemented at a relatively low manufacturing cost. Also, unlike the conventional casing that must have a larger thickness for the firm engagement with the screws or require a larger internal space for the arrangement of hooking structures, the thicknesses of the first casing body and second casing body and the internal space therebetween can be relatively small so as to reduce the overall thickness of the electronic device, making the electronic device satisfies the demands for thin and compact electronic products.

On the other hand, the removal of the fastener is also simple and convenient so that the fastener can be quickly removed and thereby improving the efficiency of the maintenance process of the electronic device without resulting damage to the casing. Also, due to the simple installation and removal steps of the fastener, it would be easy for the user to manually change the fastener of different colors or designs according to their preferences, such that the electronic device can have a rich color combination to express the personal taste and increase the economic value added.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An electronic device, comprising:
   a casing, comprising a first casing body, a second casing body and a fastener, wherein the first casing body and the second casing body each have a first side and a second side opposite to each other, the second casing body is located on the first casing body, the second casing body has an outer surface facing away from the first casing body and at least one first engagement structure protruding from the outer surface, the at least one first engagement structure has an inclined guiding surface and an engaging surface opposite to each other, and the fastener detachably clamps a side of the first casing body and the second casing body; and
   an electrical component, located between the first casing body and the second casing body; wherein the fastener includes a first extension portion, a second extension portion, and a connection portion connected between the first extension portion and the second extension portion, the first extension portion and the second extension portion extend outward from the connection portion in a parallel manner, the connection portion has an arc surface to simultaneously clamp the first casing body and the second casing body;
   wherein the second extension portion of the fastener has at least one second engagement structure, the engaging surface faces towards the second side of the second casing body and is substantially perpendicular to the outer surface of the second casing body, the inclined guiding surface is not parallel to the outer surface and the engaging surface, and the at least one second engagement structure of the fastener is detachably engaged with the engaging surface of the at least one first engagement structure.

2. The electronic device according to claim 1, wherein the first casing body and the second casing body are in contact with each other.

3. The electronic device according to claim 1, wherein the second side of the first casing body has a first casing body assembling portion, the second side of the second casing body has a second casing body assembling portion, the first casing body assembling portion is directly or indirectly detachably connected to the second casing body assembling portion, and the fastener removably clamps at least part of the first side of the first casing body and at least part of the first side of the second casing body.

4. The electronic device according to claim 1, wherein the first extension portion and the second extension portion are respectively located at two opposite surfaces of the first casing body and the second casing body.

5. The electronic device according to claim 4, wherein the arc surface of the connection portion simultaneously clamps the first side of the first casing body and the first side of the second casing body, the second side of the first casing body has an assembling slot, and the second side of the second casing body is removably inserted into the assembling slot.

6. The electronic device according to claim 1, wherein the first casing body has at least one first positioning structure, the second casing body has at least one second positioning structure corresponding to the at least one first positioning structure, one of the at least one first positioning structure and the at least one second positioning structure is a hole, another one of the at least one first positioning structure and the at least one second positioning structure is a mating protrusion inserted into the hole for positioning the first casing body and the second casing body relative to each other.

7. The electronic device according to claim 6, wherein the first casing body has a first stop surface, the first stop surface faces away from the first side of the first casing body, the second casing body has a second stop surface, the second stop surface faces toward the first side of the second casing body, when the second casing body is on the first casing body, the first stop surface faces and corresponds to the second stop surface.

8. The electronic device according to claim 4, wherein the first extension portion, the second extension portion and the connection portion together form a clamping space therebetween, and the first casing body and the second casing body are partially accommodated in the clamping space.

9. The electronic device according to claim 4, wherein an amount of the first extension portion protruding from the connection portion is less than an amount of the second extension portion protruding from the connection portion.

10. The electronic device according to claim 4, wherein the first extension portion has a first extension direction, the second extension portion has a second extension direction, and the first extension direction is substantially parallel to the second extension direction.

11. The electronic device according to claim 4, wherein the first extension portion has a first extension direction, the second extension portion has a second extension direction, the first extension direction and the second extension direction are not parallel to each other so that a distance between the first extension portion and the second extension portion gradually decreases from the connection portion toward a direction away from the connection portion.

12. The electronic device according to claim 1, wherein the first casing body has at least one first positioning structure, the second casing body has at least one second positioning structure corresponding to the at least one first positioning structure, one of the at least one first positioning structure and the at least one second positioning structure is a hole, another one of the at least one first positioning structure and the at least one second positioning structure is a mating protrusion inserted into the hole for positioning the first casing body and the second casing body relative to each other.

13. The electronic device according to claim 3, wherein the first casing body assembling portion is detachably and pivotally disposed on the second casing body assembling portion.

14. The electronic device according to claim 3, wherein the first casing body assembling portion has an assembling slot, and the second casing body assembling portion is removably inserted into the assembling slot.

15. The electronic device according to claim 3, wherein the first casing body has a first stop surface, the first stop surface faces away from the first side of the first casing body, the second casing body has a second stop surface, the second stop surface faces toward the first side of the second casing body, when the second casing body is on the first casing body, the first stop surface faces and corresponds to the second stop surface.

16. The electronic device according to claim 1, wherein the fastener is made of a single piece.

* * * * *